United States Patent
Singh et al.

(10) Patent No.: US 6,385,217 B1
(45) Date of Patent: May 7, 2002

(54) COMPACT WAVELENGTH-INDEPENDENT WAVELENGTH-LOCKER FOR ABSOLUTE WAVELENGTH STABILITY OF A LASER DIODE

(75) Inventors: Harmeet Singh; Fahri Diner, both of Boca Raton, FL (US)

(73) Assignee: Qtera Corporation, Boca Raton, FL (US)

( * ) Notice: Subject to any disclaimer, the term of this patent is extended or adjusted under 35 U.S.C. 154(b) by 0 days.

(21) Appl. No.: 09/250,879

(22) Filed: Feb. 16, 1999

(51) Int. Cl.[7] ............................................. H01S 3/10
(52) U.S. Cl. ........................ 372/20; 372/20; 372/96
(58) Field of Search ........................... 372/20, 96

(56) References Cited

U.S. PATENT DOCUMENTS

| | | | |
|---|---|---|---|
| 3,713,042 A | * 1/1973 | Kinsel | 331/94.5 |
| 4,842,358 A | 6/1989 | Hall | 350/96.15 |
| 5,323,409 A | 6/1994 | Laskoskie et al. | 372/32 |
| 5,333,000 A | * 7/1994 | Hietala | 342/368 |
| 5,684,590 A | 11/1997 | Sanders et al. | 356/350 |
| 5,745,283 A | * 4/1998 | Inagaki et al. | 359/341 |
| 6,081,539 A | * 6/2000 | Mattori et al. | 372/20 |

OTHER PUBLICATIONS

Product Data Sheet—1998 Santec Optical Components—Optical Wavelength Locker/Monitor OWL–10, two pages.
Preliminary Product Information Disclosure—WL5000—Wavelength Locking Device from JDS Fitel Corp. Nepean Ontario, Canada, two pages.

* cited by examiner

Primary Examiner—Paul Ip
Assistant Examiner—Delma R. Flores Ruiz
(74) Attorney, Agent, or Firm—Hunton & Williams

(57) ABSTRACT

A wavelength independent wave-locker arrangement is used to control the output wavelength of a laser diode. In the wave-locker arrangement, a narrow-band power splitter is responsive to the reception of a portion of an optical output signal from the laser diode for splitting the received optical signal into first and second coupler optical output signals, respectively. First and second photodetectors are coupled to receive the first and second coupler optical output signals, respectively, and generate respective corresponding first and second electrical output signals. A control unit is responsive to the reception of the first and second electrical output signals from the first and second photodetectors for generating predetermined control signals to the laser diode for maintaining the wavelength of the laser diode at a predetermined constant value.

29 Claims, 6 Drawing Sheets

COMPACT WAVELENGTH-INDEPENDENT WAVELENGTH-LOCKER FOR ABSOLUTE WAVELENGTH STABILITY OF A LASER DIODE

FIELD OF THE INVENTION

The present invention relates to method and apparatus for providing a wavelength-locker arrangement which is wavelength independent and provides for the absolute wavelength stability of a laser diode.

BACKGROUND OF THE INVENTION

Absolute wavelength accuracy of a laser diode is of paramount significance for the successful deployment of a practical dense wavelength division multiplexed (WDM) transmission system. However, due to the aging of a laser and such phenomenon, laser wavelength shifts with time. This places an undue restriction on the remaining components of a WDM transmission system. Some of these laser phenomenon issues are alleviated by the use of a wave-locker, which monitors the laser wavelength and actively changes the temperature of the device which mounts the laser in order to compensate for any wavelength drifts. However, state of the art wave-lockers are constructed using micro-optic filters or etalons which add a significant cost and size to a laser diode device. In addition, such wave-lockers have high insertion loss which leads to a reduced signal-to-noise ratio due to the use of a prior optical tap in the system. Therefore, it is of significant advantage to construct an all-fiber device which is capable of limiting the wavelength drift in a laser diode without adding significant cost.

The concept of stabilizing the wavelength of a laser diode is based on the ability to calibrate absolute wavelength drifts into measurable absolute power changes. One way, this is accomplished is by tapping a small fraction of the laser's optical output signal and sending the signal to a filter with a wavelength dependent response.

Referring now to FIG. 1, there is graphically shown an exemplary filter profile 10 in a transmission laser signal. A transmission value (dB) is shown along the vertical axis and wavelength in nanometers (nm) is shown along the horizontal axis. If a filter is designed such that the laser's center wavelength (laser line) is aligned along the edge of the filter in the manner shown in FIG. 1, it is possible to translate the wavelength information into power information. For example, it is seen in FIG. 1 that as the wavelength of the laser increases, the power at the output of the filter will increase proportionally. However, such an arrangement by itself is not adequate to ensure absolute stability of the laser diode device because a change in the power of the laser diode can be misconstrued as a wavelength change. To overcome this problem, the response of the filter has to be monitored in reflection as well.

Referring now to FIG. 2, there is graphically shown an exemplary laser diode signal where a solid line 12 shows the laser transmission through a filter, and a dashed line 14 shows the laser transmission in reflection from the filter. As is shown, the reflection response 14 of the filter is complementary to the transmission response 12 of the laser diode so that an increasing wavelength will result with a decrease in the reflected power. Since a filter's transfer function is known apriori, the ratio of the transmitted to reflected power can be used to calibrate any power drifts. Finally, "y" tracking of the response of the filter, and changing the temperature of the laser, will hold the wavelength of the laser diode at a constant value. Two classes of wave-lockers have been commercially developed using the principle of operation described above. A first class is a filter-based wave-locker, and a second class is an etalon-based wave-locker.

Referring now to FIG. 3, there is shown a block diagram of an exemplary prior art filter-based wave-locker arrangement 20 (shown within a dashed line rectangle) illustrating the first class of wave-locker. The wave-locker arrangement 20 comprises a laser source (LASER) 22, an optical power tap 24, a wave-locking device 26 (shown within a dashed line rectangle) and a control unit (CONTROL) 28. The optical output from the laser source 22 is received at an input of the power tap 24. The power tap 24 divides the received laser signal into two portions, where a first portion of the laser signal is provided as an output of the wave-locker arrangement 20, and a second portion of the laser signal is coupled to an input of the wave-locking device 26. The control unit 28 receives first and second outputs from the wave-locking device 26 and generates therefrom appropriate control signals to the laser source 22 for maintaining its wavelength at a substantially constant value.

The wave-locking device 26 comprises a wide-band power splitter (PWR.SPLIT.) 30, a wavelength discriminating filter (FILTER) 32, a first photodetector (PHOTO DETECT) 34, and a second photodetector (PHOTO DETECT) 36. An exemplary optical response of the filter 32 is shown in FIG. 4 where the vertical axis denotes transmission (dB) and the horizontal axis denotes wavelength (nm) in the manner of the graph of FIG. 1. The second portion of the laser signal outputted from the power tap 24 is received at a first terminal of the wide-band power splitter 30, a second terminal of the wide-band power splitter 30 is coupled to an input of the filter 32, a third terminal of the wide-band power splitter 30 is coupled to an input of the second photodetector 36, and a fourth terminal of the wide-band power splitter 30 is unused or pig-tailed. An output of the filter 32 is coupled to an input of the first photodetector 34, and outputs from the first and second photodetectors 34 and 36 are provided as electrical feedback signals to a control unit 28 which generates control signals to actively control the wavelength of the laser source 22.

In operation, a fraction of light from a laser source 22 (typically 5%) is tapped off by the power tap 24 and sent to the wave-locking device 26. In the wave-locking device 26, the received fractional signal is split into two portions by the power splitter 30. A first portion of the split signal is sent to the wavelength discriminating filter 32, and a second portion of the split signal is effectively unused by being directed to the fourth terminal of the power splitter 30. At the filter 32, a part of the signal is reflected back through the power splitter 30 to the second photodetector 36, and the remaining part of the received signal is transmitted to the first photodetector 34. Each of the first and second photodetectors 34 and 36 generate electrical output signals corresponding to the received input signals. The two electrical signals from the first and second photodetectors 34 and 36 are provided as feedback signals to the control unit 28. The control unit 28 uses the two feedback signals to generate control signals to the laser source 22 to monitor and control its wavelength.

The filter-based wave-locker arrangement 20 has two significant disadvantages. First, since the filter 32 is wavelength selective, it can only be used at a specific International Telecommunication Union (ITU) recommended wavelength. More particularly, the ITU has recommended a wavelength range of 1550–1576 nanometers (nm), which is called a 1550 window, within a grid or scale that has a reference frequency of 193.1 terahertz and 50 GHz intervals.

For example, in a typical 50 GHz operation, in the 1550 nm window alone there are over 100 useable wavelengths, and such a device would require fabrication of over 100 different filters leading to cost and inventory issues. Second, due to the need for splitting the incoming power to the wave-locking device 26 in the power splitter 30 so as to be able to access both the reflective and transmitted signal, the actual signal reaching the photodetectors 34 and 36 is very small. Specifically, there is a loss of 3 dB for the transmitted signal and a 6 dB loss for the reflected signal, and the signal-to-noise ratio suffers significantly leading to errors in the control unit 28.

Referring now to FIG. 5, there is shown a block diagram of an exemplary prior art etalon-based wave-locker arrangement 40 (shown within a dashed line rectangle), illustrating the second class of wave-locker. The wave-locker arrangement 40 comprises a basic optical circuit that is similar to the one shown in FIG. 3, but the filter 34 is replaced by an etalon 42. More particularly, the wave-locker arrangement 40 comprises a laser source (LASER) 22, an optical power tap 24, a wave-locking device 46 (shown within a dashed line rectangle), and a control unit 28. The wave-locking device 46 comprises a wide-band power splitter (PWR. SPLIT.) 30, an etalon 42, a first photodetector (PHOTO DETECT) 34, and a second photodetector (PHOTO DETECT) 36. The elements of the wave-locker arrangement 40 having the same designation number as those in the wave-locker arrangement 20 of FIG. 3 have corresponding functions as described hereinbefore. An optical response of the etalon 42 is shown in FIG. 6 where the vertical axis denotes transmission (dB) and the horizontal axis denotes wavelength (nm) in the manner of the graphs of FIGS. 1 and 4. By appropriate design of the etalon 42, it can be ensured that the wavelength response is periodic and consistent with an ITU grid. This obviates the need of a unique wave-locker at every wavelength, but still suffers from the need of having a wide-band 3 dB power splitter 30, high insertion loss, and consequently a low signal-to-noise ratio at the first and second photodetectors 34 and 36. Additionally, both of the wave-locker arrangements 20 and 40 require a filter 32 or an etalon 42, and a wide-band power splitter 30 making the device footprint large and expensive. Still further, while the wide-band power splitter 30 is reliable, a pig-tailing of the fourth terminal thereof, and the use of a filter 32 or etalon 42, lead to lower reliability and a high cost in addition to making the wave-locker arrangement 20 wavelength dependent.

It is desirable to provide a wavelength locking device for a laser diode which is wavelength independent, is economical and easy to fabricate, and provides for the absolute wavelength stability of the laser diode.

SUMMARY OF THE INVENTION

The present invention is directed to method and apparatus for providing a wavelength locking device which is wavelength independent and provides for the absolute wavelength stability of a laser diode.

Viewed from one aspect, the present invention is directed to a wavelength-independent wavelength-locker arrangement for controlling the output wavelength of a laser diode. The wavelength-locker arrangement comprises a narrow-band power splitter, first and second photodetectors, and a control unit. The narrow-band power splitter is responsive to the reception of a portion of an optical output signal from the laser diode for splitting the received optical signal into first and second coupler optical output signals, respectively. The first and second photodetectors are responsive to the reception of the first and second coupler optical output signals, respectively, for generating respective corresponding first and second electrical output signals. The control unit is responsive to the reception of the first and second electrical output signals from the first and second photodetectors for generating predetermined control signals to the laser diode. The control signals from the control unit maintain the wavelength of the laser diode at a predetermined value.

Viewed from another aspect, the present invention is directed to a wavelength-independent wavelength-locker arrangement for controlling the output wavelength of a laser diode. The wavelength-locker arrangement comprises an optical power tap, a narrow-band power splitter, first and second photodetectors, and a control unit. The optical power tap is responsive to an optical output signal from the laser diode for is splitting the optical output signal into first and second output optical signal portions. The first output optical signal portion is coupled into a first output optical fiber as an output signal from the wavelength-locker arrangement, and the second output optical signal portion is coupled into a second output optical fiber. The narrow-band power splitter is responsive to the reception of the second output optical signal portion from the optical power tap propagating in the second optical fiber for splitting the received second optical signal portion into first and second coupler optical output signals. The first and second photodetectors are responsive to the direct reception of the first and second coupler optical output signals, respectively, for generating respective corresponding first and second electrical output signals. The control unit is responsive to the reception of the first and second electrical output signals from the first and second photodetectors for generating predetermined control signals to the laser diode for maintaining the wavelength of the laser diode at a predetermined value.

Viewed from still another aspect, the present invention is directed to method of controlling the output wavelength of a laser diode in an wavelength-independent wavelength-locker arrangement. In a first step, a portion of an optical signal received from the laser diode at an input of a narrow-band power splitter is split into first and second coupler optical output signals. In a second step, first and second electrical output signals are generated in first and second photodetectors, respectively, from the respective first and second coupler optical output signals received directly from the narrow-band power splitter. In a third step, predetermined control signals are generated in a control unit in response to the reception by the control unit of the first and second electrical output signals from the first and second photodetectors, respectively, for maintaining the wavelength of the laser diode at a predetermined value.

The invention will be better understood from the following more detailed description taken with the accompanying drawings and claims.

DETAILED DESCRIPTION

Figure 7:
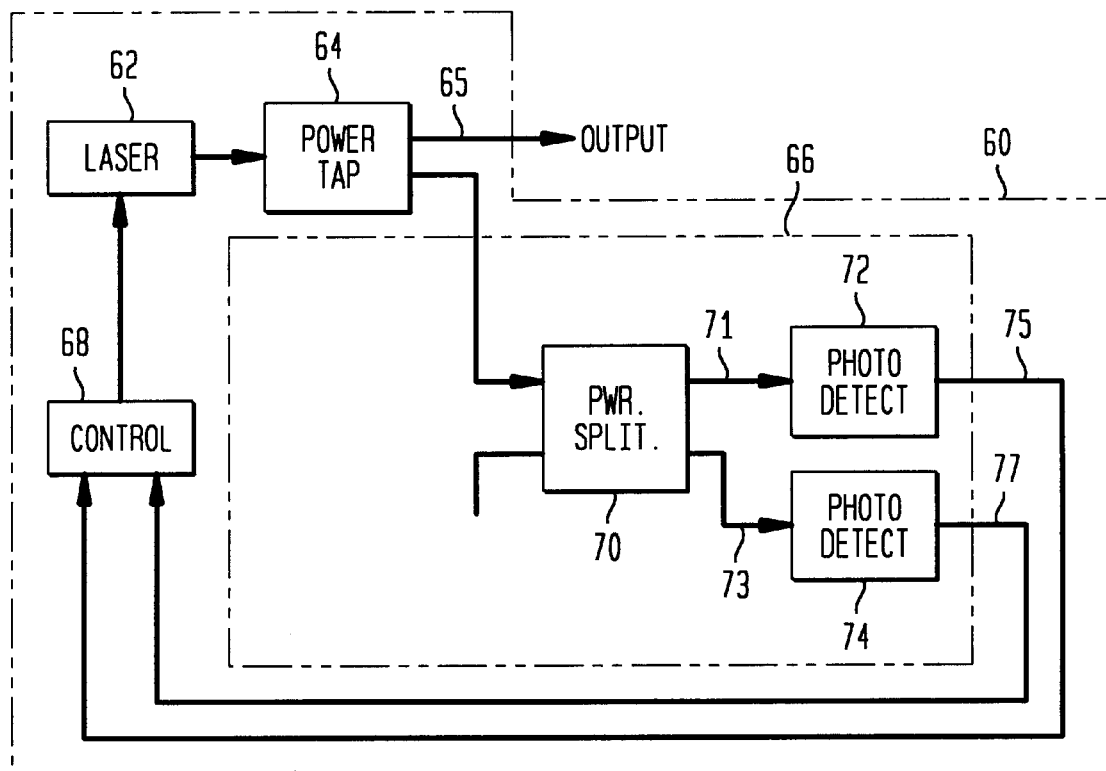
FIG. 7 and 8 show a block diagram of a wave-locker arrangement using a narrow-band power splitter, and a graphic optical response of the narrow-band power splitter, respectively, in accordance with the present invention.

Referring now to FIG. 7, there is shown a block diagram of a wave-locker arrangement 60 (shown within a dashed line rectangle) in accordance with the present invention. The wave-locker arrangement 60 comprises a laser diode source (LASER) 62, an optical power tap 64, a wave-locking device 66 (shown within a dashed line rectangle), and a control unit (CONTROL) 68. The optical output from the laser diode source 62 is received at an input of the power tap 64. The power tap 64 divides the received optical laser signal into first and second portions. The first portion of the laser signal is provided as an output signal from the wave-locker arrangement 60, and the second portion of the The control unit 68 receives first and second outputs from the wave-locking device 66 and generates appropriate control signals which are coupled to the laser diode source 62 for maintaining its wavelength at a constant value.

Figure 1:
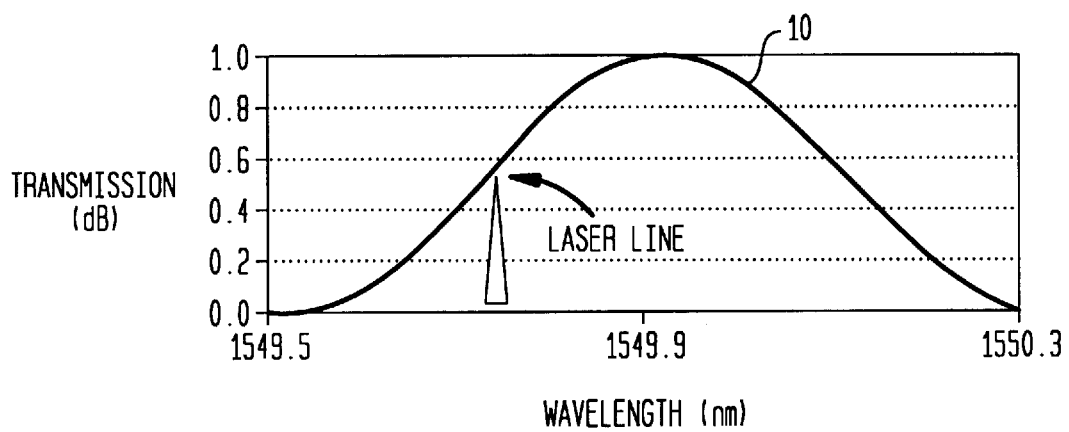
FIG. 1 graphically shows an exemplary filter profile in transmission and a laser signal.
Figure 2:
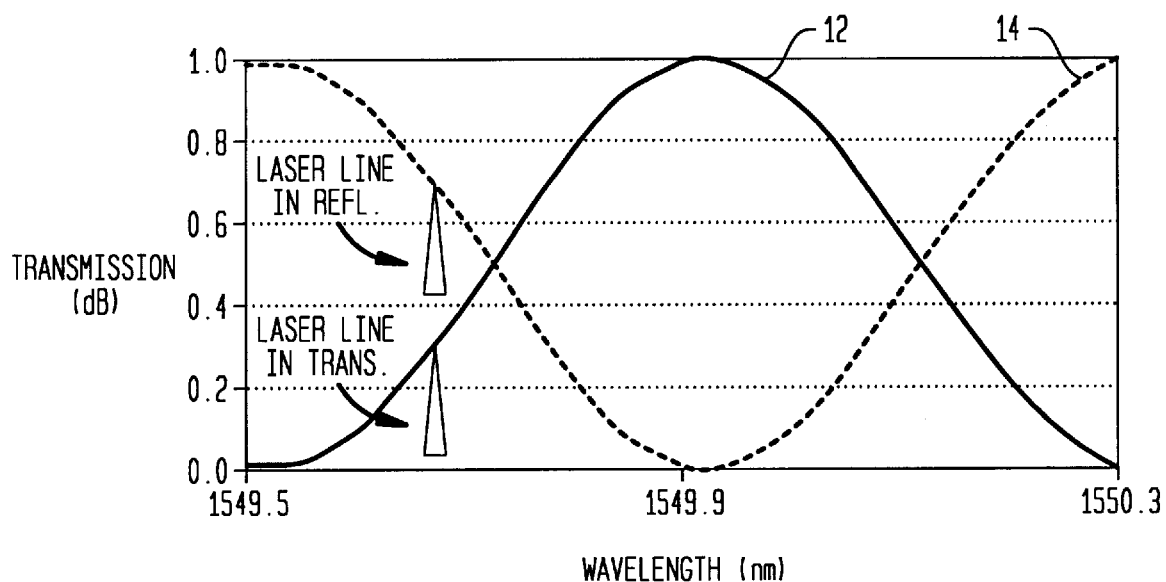
FIG. 2 graphically shows an exemplary laser signal where a solid line shows the optical laser transmission and a dashed line shows the optical laser transmission in reflection from a filter.
Figure 6:
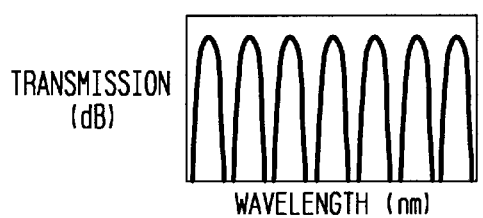
Figure 8:
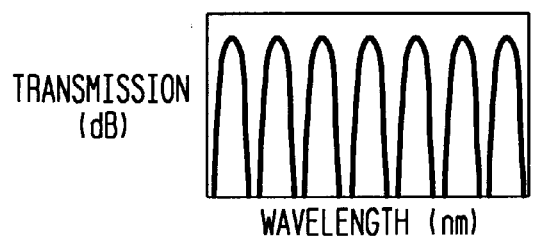

The wave-locking device 66 comprises a narrow-band power splitter (PWR. SPLIT.) 70, a first photodetector (PHOTO DETECT) 72, and a second photodetector (PHOTO DETECT) 74. An exemplary optical response of the narrow-band power splitter 70 is shown in FIG. 8 where the vertical axis denotes transmission (dB) and the horizontal axis denotes wavelength (nm) in the manner shown in the graph of FIG. 1. It should be noted that the optical response of the etalon 42 shown in FIG. 6 and the optical response of the narrow-band power splitter 70 shown in FIG. 8 appear to provide multiple wavelengths and have corresponding responses. Although the graphs are shown as having corresponding responses, it is to be understood that the actual responses are somewhat different. However, the wavelength response of the etalon 42 can be made to look like the response of the narrow-band power splitter 70 by a proper design of the etalon 42 using low reflectivity mirrors.

The second portion of the laser signal from the power tap 64 is received at a first terminal of the narrow-band power splitter 70, a second terminal of the narrow-band power splitter 70 is coupled to an input of the first photodetector 72 via an optical waveguide 71, a third terminal of the narrow-band power splitter 70 is unused, and a fourth terminal of the narrow-band power splitter 70 is coupled to an input of the second photodetector 74 via an optical waveguide 73. Each of the outputs of the first and second photodetectors 72 and 74 are provided as feedback signals to a control unit 68 via electrical leads 75 and 77, respectively. The control unit generates output control signals which are used to dynamically control the wavelength of the laser diode source 62.

In operation, a fraction of light from a laser diode source 62 is tapped off by the power tap 64, and sent to the wave-locking device 66. In the wave-locking device 66, the fractional signal is further split into first and second portions by the narrow-band power splitter 70. A first portion of the split optical signal is directly sent to the first photodetector 72 via the optical waveguide 71, and a second portion of the split optical signal is directly sent to the second photodetector 74 via the optical waveguide 73. The first and second photodetectors convert the received first and second portion, respectively, of the split optical signal into respective corresponding electrical signals. The two electrical signals from the first and second photodetectors 72 and 74 are provided as feedback signals to the control unit 68 via electrical leads 75 and 77, respectively. The control unit 68 uses the two feedback signals to generate control signals to the laser diode source 62 to maintain its wavelength at a constant value.

In the wave-locking arrangement 60, the narrow-band power splitter 70, which is a modal interferometer, is used to achieve the required wave-locking function. The properties of the narrow-band splitter coupler 70 (modal interferometer) are adjusted such that the peaks in its wavelength response shown in FIG. 8 are periodic with the ITU grid, and are ideally offset from the desired laser wavelength by one quarter of the Free Spectral Range of the modal interferometer 70.

Figure 9:
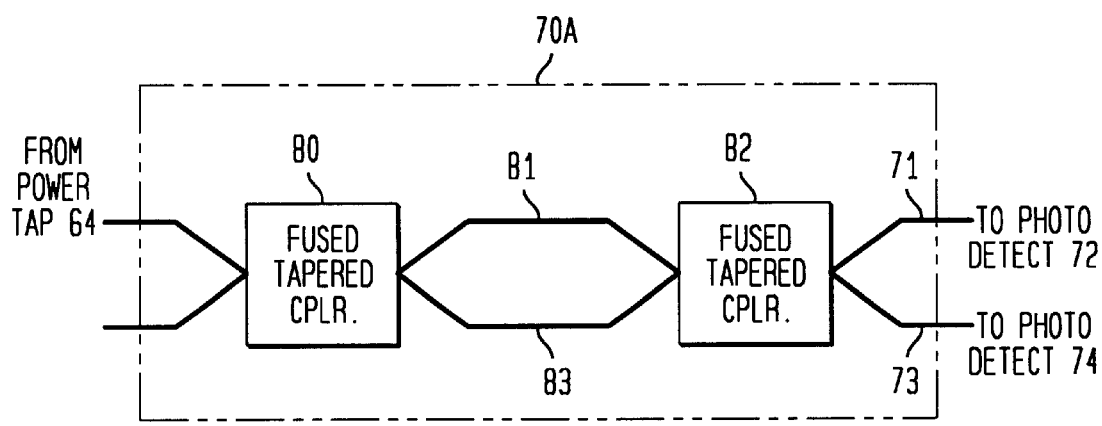
FIG. 9 shows a block diagram of the narrow-band Mach Zehnder used in the wave-locker arrangement of FIG. 7 in accordance with a first embodiment of the present invention.

Referring now to FIG. 9, there is shown an exemplary arrangement of a narrow-band power splitter 70A (a Mach-Zehnder interferometer) (shown within a dashed line rectangle) for use as the narrow-band power splitter 70 of FIG. 7 comprising first and second fused tapered couplers (FUSED TAPERED CPLR.) 80 and 82. The output from the power tap 64 in the wave-locking arrangement 60 of FIG. 7 is coupled to one input of the first fused tapered coupler 80. First and second outputs from the first fused tapered coupled 80 are coupled to first and second inputs of the second fused tapered coupler 82 via optical waveguides 81 and 83, respectively. A first output of the second fused tapered coupler 82 is coupled to an input of the first photodetector (PHOTO DETECT) 72 via optical waveguide 71. A second output of the second fused tapered coupler 82 is coupled to an input of the second photodetector (PHOTO DETECT) 74 via optical waveguide 73.

In operation, the optical signal from power tap 64 enters the first fused tapered coupler 80 and is split into first and second portions that are transmitted over optical waveguides 81 and 83, respectively, to the respective first and second inputs of the second fused tapered coupler 82. The resultant wavelength response obtained in the optical waveguides 71 and 73 at the outputs of the second fused tapered coupler 82 are graphically shown in FIG. 11.

Figure 11:
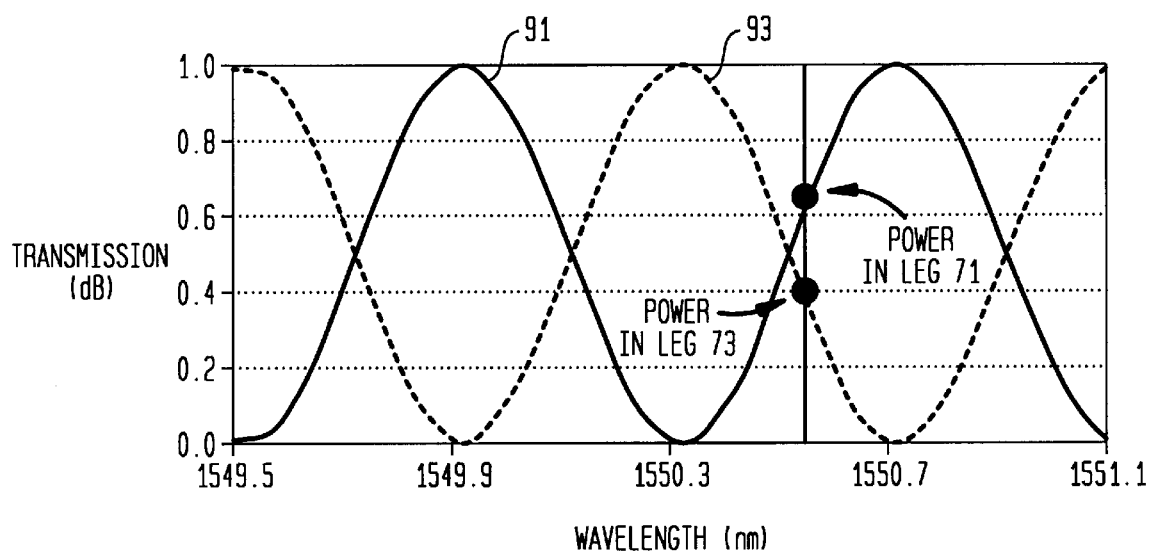
FIG. 11 graphically shows a first and second output from the narrow-band splitter shown in FIGS. 7, 9, and 10 in accordance with the present invention.

Referring now to FIG. 11, there is graphically shown a wavelength response of the power splitter 70A shown in FIG. 9, where the vertical axis represents transmission (dB) and the horizontal axis represents wavelength (nm). The power in the optical waveguide (leg) 71 at the output of the second fused tapered coupler 82 is shown by a solid-line curve 91, while the power in the optical waveguide (leg) 73 at the output of the second fused tapered coupler 82 is shown by a dashed-line curve 93. The two curves are complementary in nature. Therefore, when feedback signals from the photodetectors 72 and 74, corresponding to the waveforms of FIG. 11, are fed back to the control unit 68 (shown in FIG. 7), they are used to by the control unit 68 to generate control signals to the laser diode source 62 that dynamically maintains its wavelength (or frequency) constant. From FIG. 11, it can be seen that wavelength dependent filtering is available at the periods of 50 GHz, and that the coupler 70A can be used at any wavelength on the 50 GHz grid (or a higher integer multiple).

Figure 10:
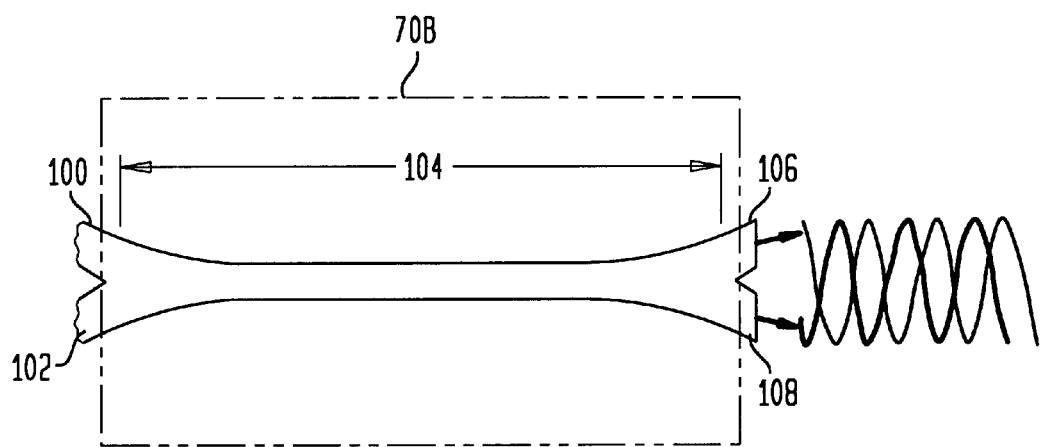
FIG. 10 shows an arrangement of the narrow-band splitter used in the wave-locker arrangement of FIG. 7 in accordance with a second embodiment of the present invention.

Referring now to FIG. 10, there is shown an optical diagram of a narrow-band power splitter 70B that can be used for the narrow-band power splitter 70 in the wave-locker arrangement 60 shown in FIG. 7 in accordance with a second embodiment of the present invention. The narrow-band power splitter 70B comprises first and second optical waveguides 100 and 102 which are fused together for a predetermined distance 104 while being stretched before the fused optical waveguides are separated again to form first and second output paths 106 and 108. The output waveform responses obtained in the first and second output paths 106 and 108 are shown at the right of FIG. 10 and correspond to the waveform responses shown in FIG. 11 for the power splitter 70A shown in FIG. 9. More particularly, the heavy solid-line curve represents the waveform response in output fiber 108 while the lighter solid-line curve represents the waveform response in output fiber 106. It is to be understood that although it is indicated above that the waveform response in FIG. 11 can be used at any wavelength on the 50 GHz grid (or a higher integer multiple) for the power splitters 70, 70A or 70B shown in FIGS. 7, 9, and 10, respectively, the Mach-Zehnder interferometer can be designed for operation at any frequency spacing. Still further, a Mach-Zehnder interferometer for a desired wavelength spacing can be easily fabricated by one skilled in the art. This is accomplished by ensuring that the two legs (81 and 83 in FIG. 9) have a length differential $\delta L$ given by the equation $\delta L = w^2/(2n\delta w)$, where w is the desired wavelength, $\delta w$ is the desired wavelength spacing of the filter (e.g., the ITU grid), and n is the refractive index of the optical waveguide 81 and 83. Additionally, any arrangement of the narrow-band power splitter 30, 70A or 70B shown in FIGS. 7, 9, and 10, respectively, can be made using optical fibers or planar waveguides. For planar waveguide configurations, the power splitters 30, 70A, and 70B can be made with passive waveguides or active waveguides such as, for example, Lithium Niobate for making the splitter tunable.

The two desired outputs from each of the narrow-band power splitters 70A and 70B are available in the two output legs of these couplers 70A and 70B, and the input to the narrow-band power splitters 70A and 70B (modal interferometers) can be directly connected to the output of the power tap 64. Such a modal interferometer can easily be designed to the required specifications by a person skilled in the art of coupler design. For example, the exact properties of the narrow-band power splitter 70B, and, therefore, its absolute wavelength can be easily fixed by various methods such as placing the coupler 70B under small tension or using ultra-violet (UV) trimming of the interferometric paths to trim the index, and hence the relative path delay of the interferometer 70B.

Figure 3:
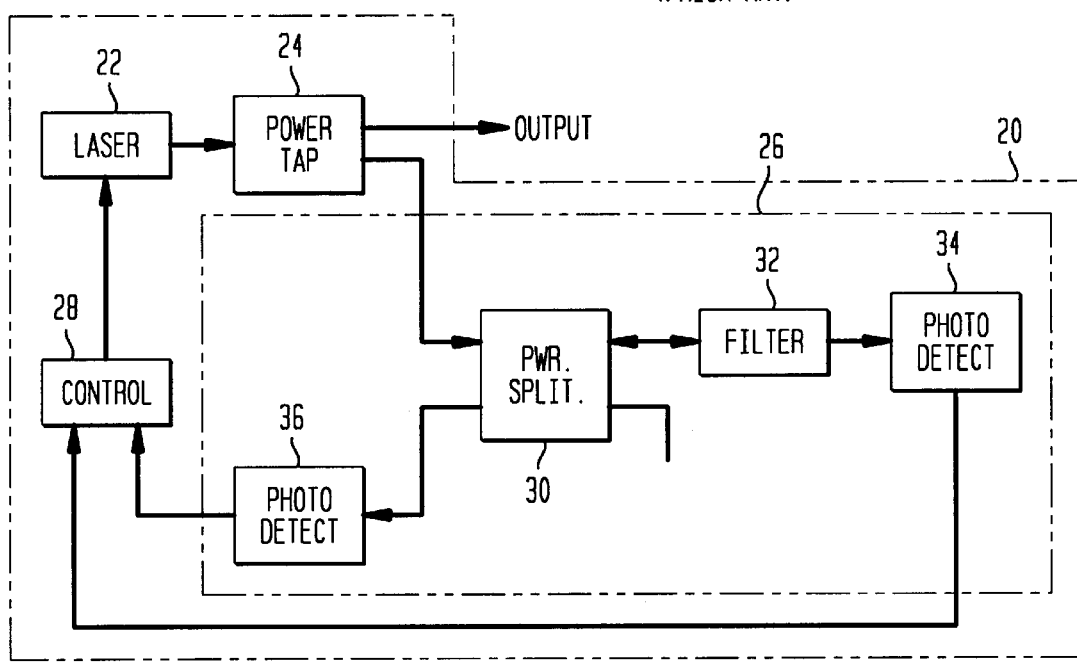
FIGS. 3 and 4 show a block diagram of a prior art filter-based wave-locker arrangement 20, and a graphic optical response of the filter therein, respectively.
Figure 4:
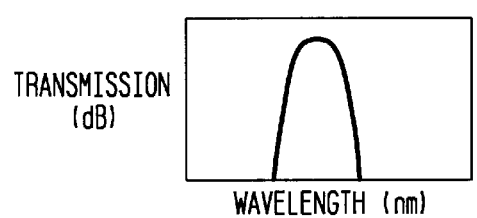
Figure 5:
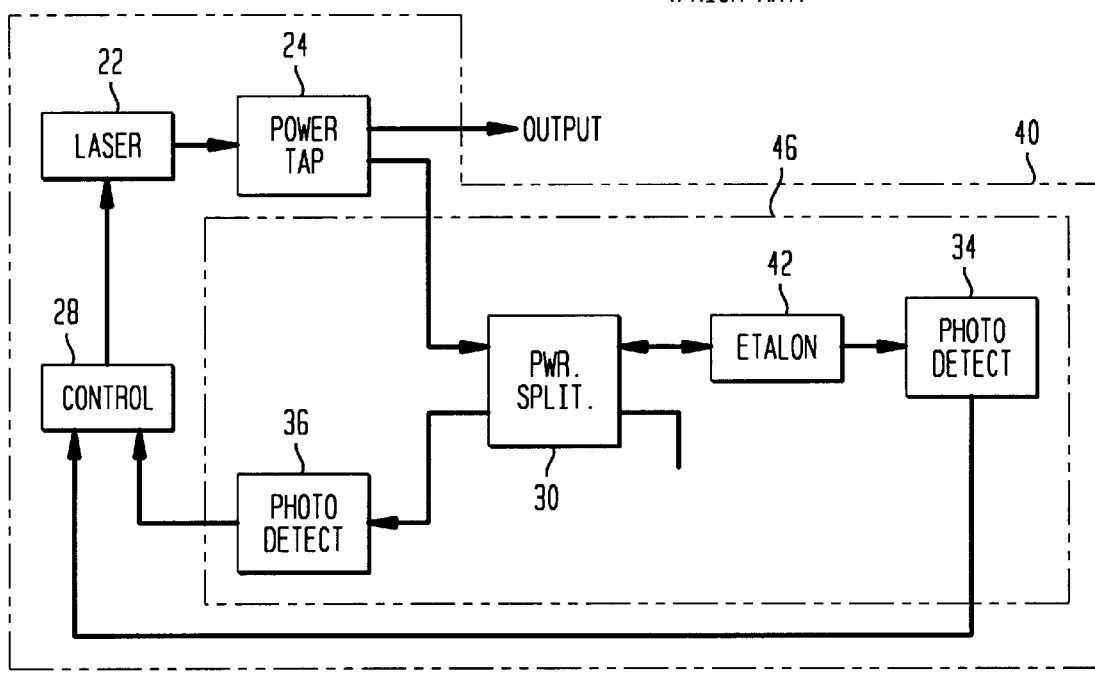
FIGS. 5 and 6 show a block diagram of a prior art etalon-based wave-locker arrangement, and a graphic optical response of the etalon therein, respectively.

In summary, the advantages of the wave-locker arrangement 60 shown in FIG. 7 can be realized by noticing that a filter-based device (shown in FIG. 3) needs a wide-band power splitter 30, and a wavelength dependent filter 32 which includes fiber pig-tailing the filter 32 at the coupler 30. While such wide-band power splitter 30 is inexpensive and reliable, the filter and pig-tailing lead to lower reliability and higher cost in addition to making the device wavelength dependent. The etalon-based wave-locker arrangement 40 (shown in FIG. 5) is not wavelength specific, but still requires fabrication and fiber pig-tailing of a Fabry-Perot etalon 42 which is expensive and has limited reliability. In contrast, wave-locker arrangement 60 (shown in FIG. 7) can be used for any wavelength and, more importantly, requires only one component, a narrow-band power splitter 30. The fabrication cost of this wave locker arrangement 60 is low, and nearly identical to the cost of a wide-band power splitter. Still further, the narrow-band power splitter 30 has proven reliability and is more compact and rugged.

It is to be appreciated and understood that the specific embodiments of the present invention described hereinbefore are merely illustrative of the general principles of the invention. Various modifications may be made by those skilled in the art which are consistent with the principles set forth. For example, the feedback signals from the photodetectors 72 and 74 in FIG. 7 can be used by the control unit 68 to dynamically control only the wavelength generated by the laser diode 62 and maintain the wavelength at a constant value. Alternatively, the feedback signals from the photodetectors 72 and 74 in FIG. 7 can be used by the control unit 68 to control both the power and the wavelength generated by the laser diode 62 in order to maintain the wavelength of the laser at a constant value. Still further, the wavelength-independent wave-locker arrangement 60 shown in FIG. 7 can be mounted on a fixture which can either hold the temperature of the arrangement 60 constant or vary the arrangement 60 to achieve stability and tunability.

What is claimed is:

1. An improved wavelength-independent wave-locker arrangement for controlling the output wavelength of a laser diode based upon a portion of an optical output signal from the laser diode, the improvement comprising:

a narrow-band power splitter responsive to the reception of the portion of the optical output signal from the laser diode for splitting the received optical signal into first and second split optical output signals, respectively;

first and second photodetectors responsive to the reception of the first and second split optical output signals, respectively, for generating respective corresponding first and second electrical output signals; and a control unit responsive to the reception of the first and second electrical output signals from the first and second photodetectors, respectively, for generating control signals for the laser diode for maintaining the wavelength of the laser diode at a predetermined value.

2. The improved wave-locker arrangement of claim 1 wherein the narrow-band power splitter is formed from first and second optical fibers.

3. The improved wave-locker arrangement of claim 1 wherein the narrow-band power splitter is formed from first and second planar waveguides.

4. The improved wave-locker arrangement of claim 3 wherein the first and second planar waveguides comprise passive waveguides for making the narrow-band power splitter tunable.

5. The improved wave-locker arrangement of claim 3 wherein the first and second planar waveguides comprise active waveguides for making the narrow-band power splitter tunable.

6. The improved wave-locker arrangement of claim 1 wherein the narrow-band power splitter is a Mach-Zehnder interferometer comprising:

a first fused tapered optical coupler including first and second input couplings and first and second output couplings, the first fused tapered optical coupler being coupled to receive the portion of the optical output signal from the laser diode at the first input coupling, and to provide first and second coupler optical signals to the first and second output couplings, respectively; and a second fused tapered optical coupler including third and fourth input couplings and third and fourth output couplings, the second fused tapered optical coupler being coupled to receive the first and second coupler optical signals from the first and second output couplings of the first fused tapered optical coupler at the third and fourth input couplings, respectively, and provide third and fourth coupler optical signals having complementary waveforms at the third and fourth output couplings, respectively.

7. The improved wave-locker arrangement of claim 1 wherein the narrow-band power splitter comprises a fused tapered coupler having first and second optical waveguides that are fused together and stretched to provide a predetermined length and shape, the first and second optical waveguides having first and second output paths, respectively, the first optical waveguide being coupled to receive the portion of the optical output signal from the laser diode and to provide first and second coupler optical output signals at the first and second output paths, respectively, which have waveforms that are complementary to each other.

8. The improved wave-locker arrangement of claim 1 further comprising:
an optical power tap coupled between an output of the laser diode and an input of the narrow-band power splitter, the optical power tap being responsive to an optical output signal from the laser diode for splitting the optical output signal from the laser diode into first and second portions, wherein the first portion is provided as an optical output signal from the improved wave-locker arrangement, and wherein the second portion is provided to the input of the narrow-band power splitter as the portion of the optical output signal from the laser diode.

9. The improved wave-locker arrangement of claim 1 wherein the control unit is responsive to the first and second electrical output signals from the first and second photodetectors for dynamically maintaining only the wavelength of the laser diode at a constant value.

10. The improved wave-locker arrangement of claim 1 wherein the control unit is responsive to the first and second electrical output signals from the first and second photodetectors for dynamically controlling both the wavelength and the power of the laser diode so that the wavelength of the laser diode is maintained at a constant value.

11. An improved wavelength-independent wave-locker arrangement for controlling the output wavelength of a laser diode, the improvement comprising:
an optical power tap responsive to an optical output signal from the laser diode for splitting the optical output signal into first and second output optical signal portions, wherein the first output optical signal portion is provided as an optical output signal from the improved wave-locker arrangement;
a narrow-band power splitter responsive to the reception of the second output optical signal portion from the optical power tap for splitting the second output optical signal portion into first and second split optical output signals;
first and second photodetectors responsive to the direct reception of the first and second split optical output signals, respectively, for generating respective corresponding first and second electrical output signals; and
a control unit responsive to the reception of the first and second electrical output signals from the first and second photodetectors, respectively, for generating control signals for the laser diode for maintaining the wavelength of the laser diode at a predetermined constant value.

12. The improved wave-locker arrangement of claim 11 wherein the narrow-band power splitter is formed from first and second optical fibers.

13. The improved wave-locker arrangement of claim 11 wherein the narrow-band power splitter is formed from first and second planar waveguides.

14. The improved wave-locker arrangement of claim 13 wherein the first and second planar waveguides comprise passive waveguides for making the narrow-band power splitter tunable.

15. The improved wave-locker arrangement of claim 13 wherein the first and second planar waveguides comprise active waveguides for making the narrow-band power splitter tunable.

16. The improved wave-locker arrangement of claim 11 wherein the narrow-band power splitter is a Mach-Zehnder interferometer comprising:
a first fused tapered optical coupler including first and second input couplings and first and second output couplings, the first fused tapered optical coupler being coupled to receive the second output optical signal portion from the optical power tap at the first input coupling, and to provide first and second coupler optical signals to the first and second output couplings, respectively; and
a second fused tapered optical coupler including third and fourth input couplings and third and fourth output couplings, the second fused tapered optical coupler being coupled to receive the first and second coupler optical signals from the first and second output couplings of the first fused tapered optical coupler at the third and fourth input couplings, respectively, and provide third and fourth coupler optical signals having complementary waveforms at the third and fourth output couplings, respectively.

17. The improved wave-locker arrangement of claim 11 wherein the narrow-band power splitter comprises a fused tapered coupler having first and second optical waveguides that are fused together and stretched to provide a predetermined length and shape, the first and second optical waveguides having first and second output paths, respectively, the first optical waveguide being coupled to receive the second output optical signal portion from the optical power tap and to provide first and second coupler optical output signals at the first and second output paths, respectively, which have waveforms that are complementary to each other.

18. The improved wave-locker arrangement of claim 11 wherein the control unit is responsive to the first and second electrical output signals from the first and second photodetectors for dynamically maintaining only the wavelength of the laser diode at a constant value.

19. The improved wave-locker arrangement of claim 11 wherein the control unit is responsive to the first and second electrical output signals from the first and second photodetectors for dynamically controlling both the wavelength and the power of the laser diode so that the wavelength of the laser diode is maintained at a constant value.

20. An improved method of controlling the output wavelength of a laser diode in a wavelength-independent wave-locker arrangement comprising the steps of:
(a) splitting a portion of an optical signal from the laser diode received at an input of a narrow-band power splitter into first and second split optical output signals;
(b) receiving the first and second split optical output signals from step (a) directly in first and second photodetectors, respectively, and generating therefrom respective first and second electrical output signals in the first and second photodetectors, respectively; and (c) generating control signals in a control unit for transmission to the laser diode in response to the reception by the control unit of the first and second electrical output signals from the first and second photodetectors, respectively, generated in step (b) for maintaining the wavelength of the laser diode at a predetermined value.

21. The improved method of claim 20 wherein in performing step (a), the narrow-band power splitter is a Mach-Zehnder interferometer and step (a) comprises the substeps of:

(a1) receiving the portion of the optical signal from the laser diode at a first input coupling of a first fused tapered coupler and for splitting the received portion of the optical signal from the laser diode into first and second coupler optical signals that are provided at first and second output couplings, respectively, of the first fused tapered coupler; and (a2) receiving the first and second coupler optical signals from the first and second output couplings, respectively, of the first fused tapered coupler generated in step (a1) at respective third and fourth input couplings of a second fused tapered coupler, and generating third and fourth coupler optical signals having complementary waveforms at third and fourth output couplings, respectively, of the second fused tapered coupler.

22. The improved method of claim 20 wherein in performing step (a), the narrow-band power splitter comprises a fused tapered coupler having first and second optical waveguides that are fused together and stretched to provide a predetermined length and shape, the first and second optical waveguides having first and second input ports and output parts, respectively, and step (a) comprises the substeps of:

(a1) receiving the portion of the optical signal from the laser diode at a first input port of the first optical waveguide; and (a2) generating first and second coupler optical output signals having waveforms that are complementary to each other in the first and second optical waveguides at the first and second output ports, respectively.

23. The improved method of claim 20 wherein prior to performing step (a), performing the step of:

(d) receiving an optical output signal from the laser diode in an optical power tap and splitting the optical output signal from the laser diode into first and second portions;

(e) transmitting the first portion from step (d) as an optical output signal from the wave-locker arrangement; and (f) concurrently transmitting the second portion from step (d) to the input of the narrow-band power splitter.

24. The improved method of claim 20 wherein in performing step (c), generating control signals in the control unit for transmission to the laser diode for dynamically controlling only the wavelength of the laser diode so that the wavelength is maintained at a constant value.

25. The improved method of claim 20 wherein in performing step (c), generating control signals in the control unit for dynamically controlling both the wavelength and the power of the laser diode so that the wavelength of the laser diode is maintained at a constant value.

26. The improved wave-locker arrangement of claim 1 wherein the first and second photodetectors are directly coupled to the first and second split optical output signals, respectively, provided by the narrow-band power splitter.

27. The improved wave-locker arrangement of claim 1 wherein the narrow-band power splitter is an interferometer that is configured to generate the first and second split optical output signals so that the first and second split optical output signals have complementary shapes.

28. The improved wave-locker arrangement of claim 11, wherein the narrow-band power splitter is an interferometer that is configured to generate the first and second split optical output signals so that the first and second split optical output signals have complementary shapes.

29. The improved method of claim 20 wherein the narrow-band power splitter is an interferometer that is configured to generate the first and second split optical output signals so that the first and second split optical output signals have complementary shapes.

* * * * *